(12) United States Patent
Saviers

(10) Patent No.: US 11,576,280 B2
(45) Date of Patent: Feb. 7, 2023

(54) COLD PLATE BRANCHING FLOW PATTERN

(71) Applicant: Raytheon Company, Waltham, MA (US)

(72) Inventor: Kimberly Saviers, Glastonbury, CT (US)

(73) Assignee: Raytheon Company, Waltham, MA (US)

(*) Notice: Subject to any disclaimer, the term of this patent is extended or adjusted under 35 U.S.C. 154(b) by 0 days.

(21) Appl. No.: 17/175,084

(22) Filed: Feb. 12, 2021

(65) Prior Publication Data

US 2022/0264766 A1 Aug. 18, 2022

(51) Int. Cl.
*H05K 7/20* (2006.01)

(52) U.S. Cl.
CPC ..... *H05K 7/20254* (2013.01); *H05K 7/20272* (2013.01)

(58) Field of Classification Search
CPC . H01L 23/473; H01L 23/367; H01L 23/3675; H01L 23/3677; H01L 23/3672; F28F 3/12; F28F 2260/02; F28F 3/048; F28F 13/08; F28F 13/12; F28F 3/02; H05K 7/20254; H05K 7/20218; H05K 7/20272; H05K 7/20927; H05K 7/20; H05K 7/20509; H05K 7/2039; H05K 7/20763
See application file for complete search history.

(56) References Cited

U.S. PATENT DOCUMENTS

| | | | |
|---|---|---|---|
| 6,688,381 B2 | 2/2004 | Pence et al. | |
| 2002/0125001 A1* | 9/2002 | Kelly | F28F 7/02 165/165 |
| 2005/0128705 A1* | 6/2005 | Chu | H01L 23/473 361/689 |
| 2006/0002087 A1* | 1/2006 | Bezama | H01L 23/473 257/E23.098 |
| 2006/0225867 A1* | 10/2006 | Park | F28F 9/0263 165/170 |
| 2011/0226448 A1* | 9/2011 | Valenzuela | F28F 3/12 165/173 |

(Continued)

FOREIGN PATENT DOCUMENTS

EP 3076428 A1 10/2016

OTHER PUBLICATIONS

International Search Report and Written Opinion from PCT Application Serial No. PCT/US2021/060022, dated Mar. 11, 2022, 17 pages.

*Primary Examiner* — Adam B Dravininkas
(74) *Attorney, Agent, or Firm* — Kinney & Lange, P.A.

(57) ABSTRACT

A cold plate includes an outer housing, and a fluid circuit within the outer housing. The fluid circuit includes a fluid inlet located on a first sidewall of the outer housing, a fluid outlet located on the first sidewall of the outer housing, and a primary channel disposed between and fluidly connecting the fluid inlet and the fluid outlet. The primary channel includes an inlet leg downstream of the fluid inlet, an outlet leg upstream of the fluid outlet, and a connecting portion fluidly connecting the inlet leg and the outlet leg. The fluid circuit further includes a first secondary channel branching from the inlet leg of the primary channel, and a second secondary channel branching from the outlet leg of the primary channel.

14 Claims, 4 Drawing Sheets

(56) References Cited

U.S. PATENT DOCUMENTS

| | | |
|---|---|---|
| 2012/0285660 A1 | 11/2012 | Poltorak |
| 2015/0121701 A1 | 5/2015 | Loong et al. |
| 2016/0129792 A1* | 5/2016 | Gohara .................. B60K 1/00 |
| | | 29/890.035 |
| 2017/0303431 A1 | 10/2017 | Kim |
| 2019/0373772 A1* | 12/2019 | Mayberry ............... F28F 13/14 |
| 2020/0273777 A1 | 8/2020 | Jain et al. |
| 2020/0284532 A1 | 9/2020 | Becene et al. |
| 2021/0156627 A1* | 5/2021 | Coddé ....................... F28F 3/12 |

\* cited by examiner

COLD PLATE BRANCHING FLOW PATTERN

BACKGROUND

The present disclosure relates generally to cold plates, and more particularly, to a cold plate fluid circuit with branching channels.

Many thermal management systems use cold plates to cool heat-generating electronics. Most cold plates are designed to pass a single fluid across the plate to absorb waste heat from associated electronics. Various standard designs include u-turns or other circuitous internal fluid channels that may also include fins. Current design processes and manufacturing methods limit the complexity of cold plate designs, thus limiting thermal transfer capabilities. New fluid channel designs are desirable for improving thermal transfer and flow performance across the cold plate.

SUMMARY

A cold plate includes an outer housing, and a fluid circuit within the outer housing. The fluid circuit includes a fluid inlet located on a first sidewall of the outer housing, a fluid outlet located on the first sidewall of the outer housing, and a primary channel disposed between and fluidly connecting the fluid inlet and the fluid outlet. The primary channel includes an inlet leg downstream of the fluid inlet, an outlet leg upstream of the fluid outlet, and a connecting portion fluidly connecting the inlet leg and the outlet leg. The fluid circuit further includes a first secondary channel branching from the inlet leg of the primary channel, and a second secondary channel branching from the outlet leg of the primary channel.

A cold plate assembly includes an outer housing, a fluid circuit within the outer housing, and at least one heat-generating component mounted to and in a thermal exchange relationship with the outer housing. The fluid circuit includes a fluid inlet, a fluid outlet, and a primary channel disposed between and fluidly connecting the fluid inlet and the fluid outlet. The fluid circuit further includes a plurality of secondary channels branching from the primary channel and a plurality of tertiary channels branching from a first of the plurality of secondary channels and a second of the plurality of secondary channels.

Figure 1:
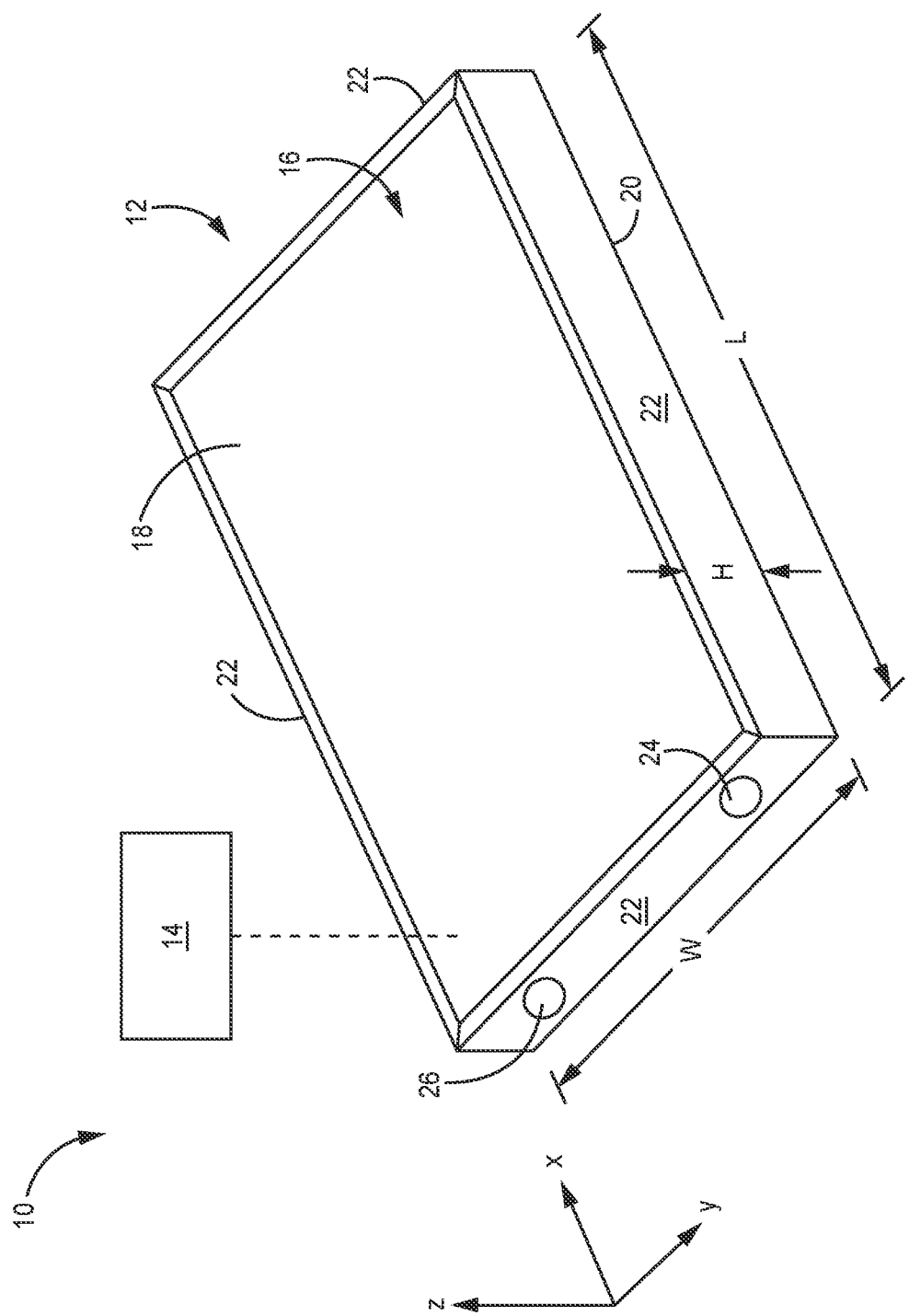
FIG. 1 is a perspective view of a cold plate assembly.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

This disclosure presents a cold plate fluid circuit with a branching pattern. The fluid circuit includes a primary channel, secondary channels branching from the primary channel, and in some embodiments, tertiary channels branching from the secondary channels. The branching pattern allows for even flow distribution and thermal transfer compared to traditional designs with single channel fluid circuits.

FIG. 1 is a simplified perspective view of cold plate assembly 10 including cold plate 12 and at least one heat-generating component 14 in thermal communication with cold plate 12. Although represented schematically, heat-generating component 14 can be an electronic component in physical contact with cold plate 12 such as removably mounted to cold plate 12 as is discussed in greater detail below.

Cold plate 12 includes outer housing 16 which includes cover plate 18, an oppositely disposed base plate 20, and four side walls 22. Outer housing 16 can be formed from a metal or non-metal material suitable for thermal management applications. Fluid inlet 24 and fluid outlet 26 are disposed in a widthwise sidewall 22, as shown in FIG. 1. Fluid inlet 24 can be a port or other opening in communication with a source of cooling fluid F for receiving cooling fluid F (labeled in FIG. 2), while fluid outlet 26 can be a port or other opening for exhausting used cooling fluid F. In the embodiment shown, fluid inlet 24 and fluid outlet 26 are disposed in the same sidewall 22, however in alternative embodiments, fluid inlet 24 can be disposed in a first sidewall 22, while fluid outlet 26 can be disposed elsewhere, such as in an adjacent or oppositely disposed sidewall 22.

In the embodiment of FIG. 1, outer housing 16 gives cold plate 12 a generally rectangular, three-dimensional structure having a length L along the x-axis, a width W along the y-axis, and a height H along the z-axis. As shown, the dimensions of cold plate 12 are such that $L>W>H$, although other dimensions are contemplated herein based on, for example, spatial constraints and/or thermal transfer requirements. As such, cold plate 12 can have other polygonal geometries, such as a square ($L=W>H$) or cube ($L=W=H$). In an alternative embodiment, cold plate 12 can have one or more curved sides to form a rounded shape, a shape having curved and straight sides, or a more freeform shape.

Figure 2:
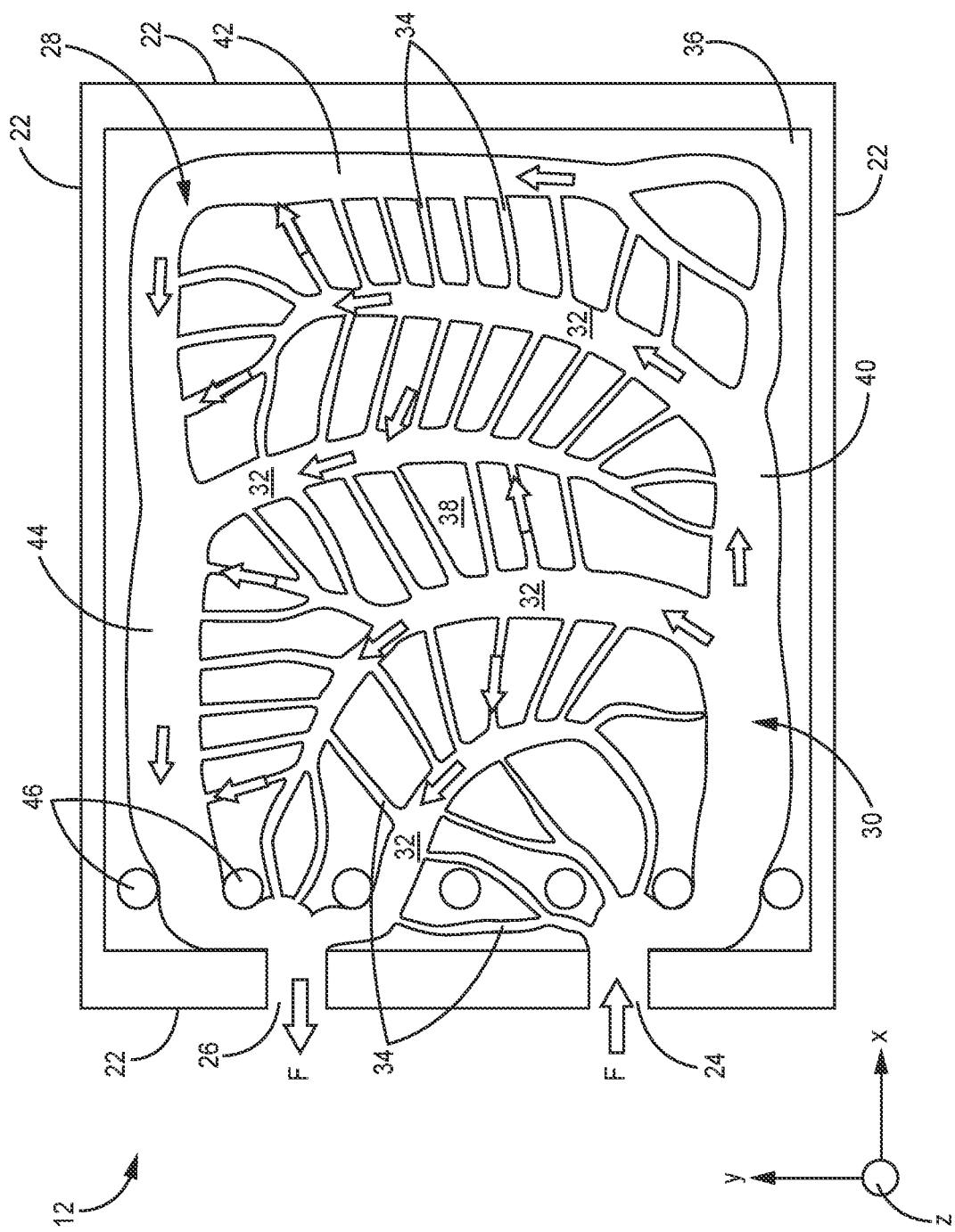
FIG. 2 is a top plan view of the cold plate assembly with the cover plate removed to illustrate a fluid circuit disposed through the cold plate.

FIG. 2 is a top plan view of cold plate 12 shown without cover plate 18 to expose fluid circuit 28 disposed within an interior space defined by outer housing 16. Fluid circuit 28 of cold plate 12 includes primary channel 30, secondary channels 32, and tertiary channels 34. Peripheral wall 36 and center wall 38 together at least partially define primary channel 30, secondary channels 32, and tertiary channels 34. More specifically, walls 36 and 38 can be formed from a solid metal or non-metal material extending variably along the x, y, and z-axes to define the various channels. In certain embodiments, peripheral wall 36 and/or center wall 38 can be formed as a generally continuous, single wall structure, or as discrete wall segments grouped in such a way as to form a wall structure.

In the embodiment shown in FIG. 2, primary channel 30 has a generally u-shaped geometry to fluidly connect fluid inlet 24 and fluid outlet 26 disposed in the same sidewall 22. As such, u-shaped primary channel 30 includes inlet leg 40 as the section of primary channel 30 immediately downstream of inlet 24 and disposed generally along the x-axis. Connecting portion 42 of primary channel 30 is disposed generally along the y-axis and fluidly connects inlet leg 40 to outlet leg 44. Outlet leg 44 is immediately upstream of fluid outlet 26 and is generally parallel to inlet leg 40.

Secondary channels 32 branch from primary channel 30. In the embodiment shown in FIG. 2, secondary channels 32 have a somewhat curved geometry but branch generally perpendicularly (with some segments disposed along the y-axis) from each of inlet leg 40 and outlet leg 44 and have an interdigitated configuration due to the meandering/winding geometry of center wall 38. An alternative embodiment could additionally/alternatively include secondary channel (s) 32 branching from connecting portion 42.

Tertiary channels 34 branch from secondary channels 32 and are disposed within the solid material of center wall 38. Tertiary channels 34 branch in various directions such that some tertiary channels 34 can be disposed generally along the x-axis, some other tertiary channels 34 can be disposed generally along the y-axis, and yet other tertiary channels can be disposed in angled between the x and y-axes. The disposition of tertiary channels 34 allows for the fluid interconnection of primary and secondary channels, as is discussed in greater detail below.

One or more holes 46 can also be formed through the solid material of walls 36 and/or 38 as well as a portion of outer housing 16 (e.g., base plate 20). Holes 46 are configured to accommodate fasteners (not shown) for removably attaching cold plate 12 to another structure such as heat-generating component 14 or a mount.

Figure 3:
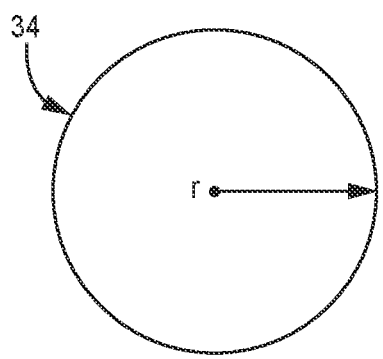
FIG. 3 is a simplified cross-sectional view of a tertiary channel of the fluid circuit.

Primary channel 30, secondary channels 32 and tertiary channels 34 can have a cross-sectional area A. Cross-sectional area can be determined by the cross-sectional geometry of a channel, for example, $A=\pi r^2$ for a circular cross-sectional shape (as shown in FIG. 3), and $A=\pi r_1 r_2$ for an elliptical shape, where $r_1$ and $r_2$ represent major and minor axes, respectively. For quadrilateral cross-sectional geometries, $A=LW$, where L is length and W is width. Other, more irregular geometries including curved and/or straight sections are contemplated herein. The cross-sectional shape and/or area of any of primary channel 30, secondary channels 32, and/or tertiary channels 34 can vary along the individual channel length based on flow requirements and/or design optimization.

Generally, an average cross-sectional area of primary channel 30 is greater than an average cross-sectional area of a secondary channel 32, and an average cross-sectional area of a secondary channel 32 is greater than an average cross-sectional area of a tertiary channel 34. Additionally, and as can be seen in FIG. 2, the number of secondary channels 32 is greater than the number of primary channels (one), and the number of tertiary channels 34 is greater than the number of secondary channels 32.

FIG. 2 includes arrows to indicate the flow pattern of cooling fluid F through fluid circuit 28. It should be understood, however, that not all possible flow paths are marked by arrows. Cooling fluid F can be water, air, oil, ethylene glycol, or a refrigerant, to name a few, non-limiting examples. Any of the cooling fluids, such as refrigerants, can further be two-phase (e.g., vapor-liquid) fluids.

In operation, cooling fluid F enters fluid circuit 28 via fluid inlet 24 and travels in a first direction along inlet leg 40 of primary channel 30. A portion of the cooling fluid enters secondary channels 32 branching from inlet leg 40 (inlet-side secondary channels 32), while another portion of the cooling fluid remains in primary channel 30, continuing along connecting portion 42 and outlet leg 44. Cooling fluid flows along outlet leg in the opposite direction of cooling fluid within inlet leg 40. Cooling fluid entering inlet-side secondary channels 32 flows through branching tertiary channels 34 formed in portions of center wall 38 defining the particular secondary channel 32. As can be seen in FIG. 2, a subset of tertiary channels 34 fluidly connects an inlet-side secondary channel 32 to outlet leg 44. Another subset of tertiary channels 34 fluidly connects an inlet-side secondary channel 32 to a secondary channel 32 branching from outlet leg 44 (outlet-side secondary channel 32). Yet another subset of tertiary channels 34 fluidly connects inlet-side secondary channels 32 to connecting portion 42. Finally, yet another subset of tertiary channels 34 branch directly from inlet leg 40 and extend to an outlet-side secondary channel 32 to fluidly connect inlet leg 40 and the outlet-side secondary channel 32. Used cooling fluid F is exhausted from fluid circuit 28 via fluid outlet 26. Used cooling fluid generally has a temperature higher than the temperature of cooling fluid F at fluid inlet 24 due to absorption of waste heat from heat-generating component 14. The branching design and interconnection of channels within fluid circuit 28 allows for more even distribution of fluid flow and thermal transfer across cold plate 12, because cooling fluid F can flow generally simultaneously across the plane of fluid circuit 28 defined by the x and y-axes using the primary, secondary, and tertiary channels.

In the embodiment shown in FIG. 2, fluid inlet 24 and fluid outlet 26 are both disposed in a common sidewall 22, however, other arrangements are possible. For example, fluid outlet 26 can be disposed within an adjacent or opposing sidewall 22 in an alternative embodiment. Another alternative embodiment can include multiple fluid inlets 24 and/or multiple fluid outlets 26 in a common sidewall 22 or in separate sidewalls 22. In any case, fluid circuit 28 can be tailored such that primary channel 30 fluidly connects all fluid inlets 24 and all fluid outlets 26.

In an exemplary embodiment, cold plate 12 can be formed partially or entirely by additive manufacturing. For metal components (e.g., Inconel, aluminum, titanium, etc.) exemplary additive manufacturing processes include powder bed fusion techniques such as direct metal laser sintering (DMLS), laser net shape manufacturing (LNSM), electron beam manufacturing (EBM), to name a few, non-limiting examples. For polymer or plastic components, stereolithography (SLA) can be used. For ceramic materials, binder jetting, photopolymerization, SLA, or a material deposition method can be used. Additive manufacturing is particularly useful in obtaining unique geometries such as the shape of walls 36 and 38, the branching pattern of fluid circuit 28, and/or the varied geometries of individual fluid channels. However, other suitable manufacturing process, such as brazing, can be used.

Figure 4:
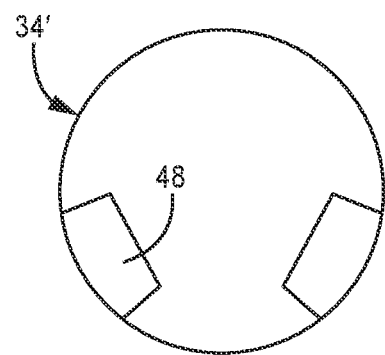
FIG. 4 is a simplified cross-sectional view of an alternative embodiment of a tertiary channel of the fluid circuit.
Figure 5:
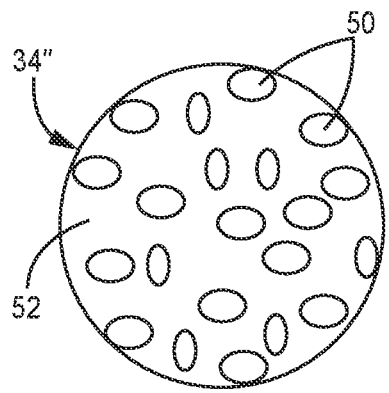
FIG. 5 is a simplified cross-sectional view of a second alternative embodiment of a tertiary channel of the fluid circuit.
Figure 6:
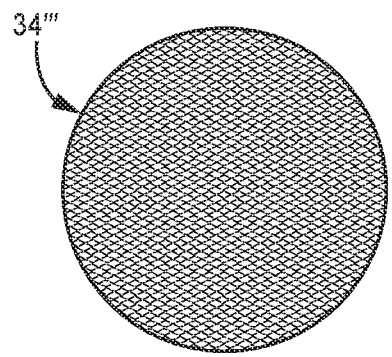
FIG. 6 is a simplified cross-sectional view of a third alternative embodiment of a tertiary channel of the fluid circuit.

In addition to complex channel shapes and branching patterns, individual channels can include features within an interior portion (i.e., fluid handling portion) of the channel. FIG. 3 is a simplified cross-sectional view of a tertiary channel 34, shown as an open channel (i.e., nothing formed in the interior space). FIGS. 4, 5, and 6 are simplified cross-sectional views of alternative tertiary channels 34', 34", and 34''', respectively, each having internal features.

As shown in FIG. 3, tertiary channel 34 has a cross-sectional area defined by its radius r. Although shown as a generally circular cross-section, it should be understood that tertiary channel 34 can have other types of symmetrical or irregular geometries, as was previously discussed. In the embodiment of FIG. 4, tertiary channel 34' includes internal fins 48. Fins 48 can be uniformly or non-uniformly distributed in tertiary channel 34' based on, for example, desired fluid flow characteristics (e.g., direction, velocity, etc.). Although shown with relatively straight edges, fins 48 can have various geometries. As such, fins 48 can be formed by additive manufacturing to achieve the desired distribution and geometries. FIG. 5 shows another alternative embodiment in which tertiary channel 34" includes pores 50 within a solid matrix material 52. Solid matrix material 52 can be equivalent to the solid material forming center wall 38, as tertiary channel 34" can be disposed within center wall 38 like tertiary channels 34 of FIG. 2. Tertiary channel 34" can be formed, for example, by additively manufacturing center wall 38 in select locations such that the build material is less densely packed as compared to more densely packed (solid) regions of center wall 38 to form a porous channel 34" with pores 50 for permitting an amount of cooling fluid F to pass through tertiary channel 34". Tertiary channel 34" may be desirable if, for example, where structural requirements favor more solid material and pores 50 are sufficient to meet fluid flow requirements. FIG. 6 shows tertiary channel 34''' with an internal lattice network. Such an embodiment may be desirable if, for example, for increased structural rigidity of the fluid circuit. It is further contemplated that an alternative embodiment can include one or a combination of tertiary channels 34, 34', 34" and/or 34'''. In alternative embodiments the features of tertiary channels 34', 34", and/or 34''' can be additionally or alternatively included within primary channel 30 and/or secondary channels 32.

Figure 7:
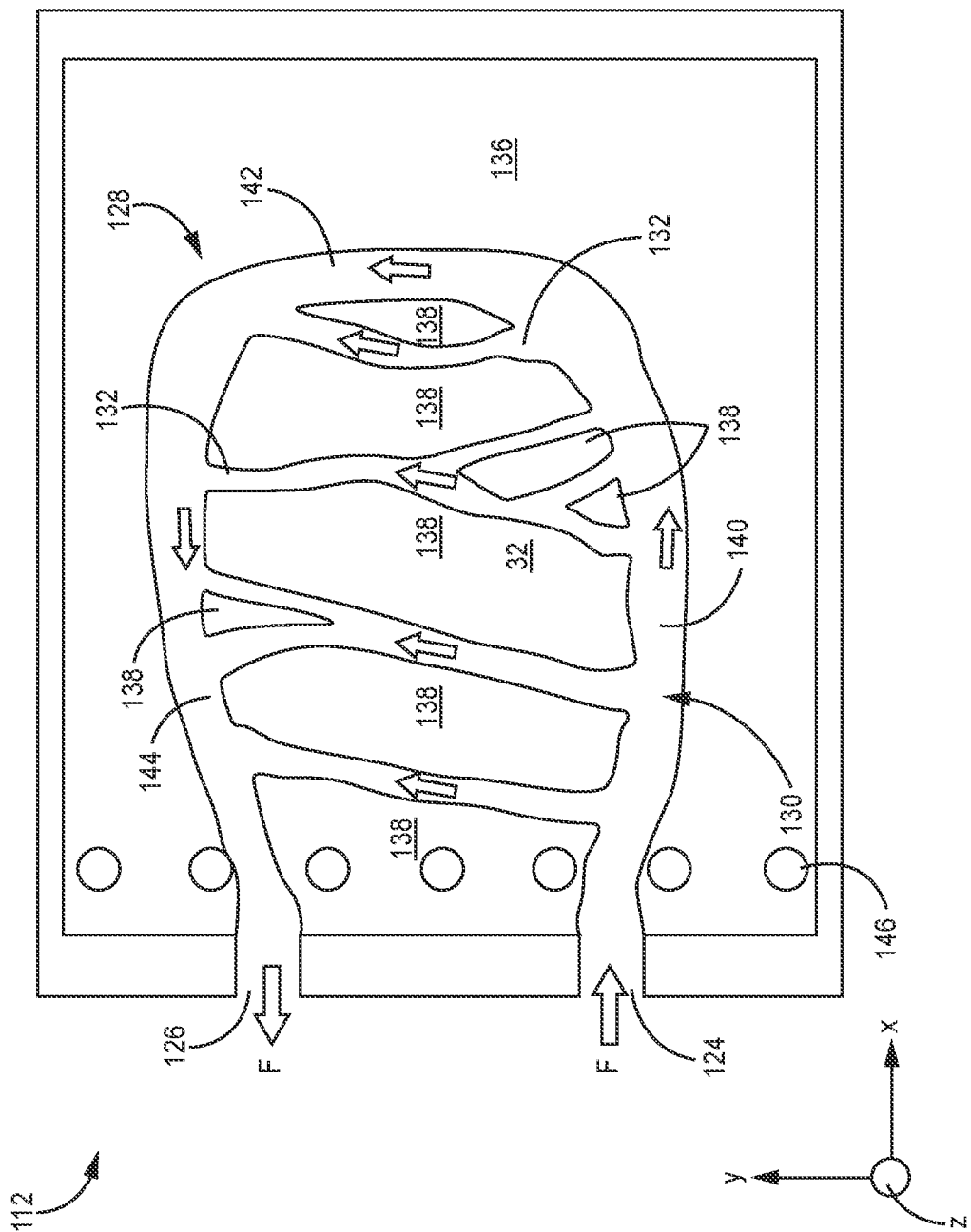
FIG. 7 is a top plan view of an alternative cold plate assembly with the cover plate removed to illustrate a fluid circuit disposed through the cold plate.

FIG. 7 is a top plan view of alternative cold plate 112 showing fluid circuit 128. Aside from particular aspects of the arrangement of fluid circuit 128, cold plate 112 can be substantially similar to cold plate 12 (e.g., in size, dimension, manufacture, relationship to heat- generating component(s) 14, etc.). As shown in FIG. 7, fluid circuit 128 includes peripheral wall 136 and center wall 138, which as shown, if formed as discrete wall segments. Peripheral wall 136 and center wall 138 together define primary fluid channel 130, which has a u-shaped geometry like primary fluid channel 30, fluidly connecting fluid inlet 124 and fluid outlet 126. Segments of center wall 138 define secondary channels 132. Primary channel 130 includes inlet leg 140, connecting portion 142, and outlet leg 144. Secondary channels 132 are disposed generally perpendicularly to and between (i.e., along the y-axis) inlet leg 140 and outlet leg 144 of primary channel 130. In this respect, secondary channels 132 differ from secondary channels 32 of FIG. 2 in that a secondary channel 132 directly fluidly connects inlet leg 140 and outlet leg 144, whereas each secondary channel 32 was truncated by wall 38, and indirectly fluidly connected inlet leg 40 and outlet leg 44 via one or more tertiary channels 34. However, the disposition of secondary channels 132 between inlet leg 140 and outlet leg 144 still permits cooling fluid F to flow along both the x and y-axes during operation of fluid circuit 128. Like primary channel 30 and secondary channels 32, primary channel 130 and any of secondary channels 132 can have a cross-sectional area that can vary (e.g., from channel to channel or along a single channel). Further, an average cross-sectional area of primary channel 130 can be greater than an average cross-sectional area of a secondary channel 132. Holes 146 are included in cold plate 112 and are substantially similar to holes 46.

Cold plates 12 and 112 as discussed above can alternatively have a variety of configurations not discussed above. For example, fluid circuit 28 can include further branching stages beyond tertiary channels (e.g., quinary, senary, septenary, etc.) based on thermal transfer requirements and/or design parameters. Generally, the final ($n^{th}$) branching stage in any embodiment will fluidly connect earlier stages of the fluid circuit across the plane of the fluid circuit. The various walls and channels can further have geometries not discussed herein. Additionally, alternative fluid circuits can be configured to receive a warm fluid and reject heat from the fluid to an associated component requiring heating instead of cooling. In such an embodiment, the fluid exhausted from the fluid circuit would generally have a lower temperature than the fluid entering the fluid circuit. Receiving a relatively hot fluid can be useful, for example, during or after a cold soak condition of the system, vehicle, etc., or generally to improve overall performance of associated electronics.

The disclosed cold plates have many benefits. The branched fluid circuit design allows for greater heat transfer and flow distribution than traditional fluid circuits. This can allow for a relatively compact cold plate assembly which is advantageous in applications with high thermal loads and/or where increased size and weight of an assembly is not desirable.

DISCUSSION OF POSSIBLE EMBODIMENTS

The following are non-exclusive descriptions of possible embodiments of the present invention.

A cold plate includes an outer housing, and a fluid circuit within the outer housing. The fluid circuit includes a fluid inlet located on a first sidewall of the outer housing, a fluid outlet located on the first sidewall of the outer housing, and a primary channel disposed between and fluidly connecting the fluid inlet and the fluid outlet. The primary channel includes an inlet leg downstream of the fluid inlet, an outlet leg upstream of the fluid outlet, and a connecting portion fluidly connecting the inlet leg and the outlet leg. The fluid circuit further includes a first secondary channel branching from the inlet leg of the primary channel, and a second secondary channel branching from the outlet leg of the primary channel.

The cold plate of the preceding paragraph can optionally include, additionally and/or alternatively, any one or more of the following features, configurations and/or additional components:

In the above cold plate, the outlet leg can be parallel to the inlet leg such that the primary channel has a u-shaped geometry.

Any of the above cold plates can further include a center wall disposed within the core body between the inlet leg and the outlet leg, the center wall at least partially defining the first secondary channel and the second primary channel.

In any of the above cold plates, each of the first secondary channel and second secondary channel directly fluidly connect the inlet leg and the outlet leg.

In any of the above cold plates, the center wall can have a meandering geometry, and each of the first secondary channel and second secondary channel can be truncated by the center wall.

Any of the above cold plates can further include a plurality of tertiary channels disposed within the center wall.

In any of the above cold plates, a first subset of the plurality of tertiary channels can branch from the first secondary channel and fluidly connect the first secondary channel to the outlet leg.

In any of the above cold plates, a second subset of tertiary channels can branch from the first secondary channel and fluidly connect the first secondary channel to the second secondary channel.

In any of the above cold plates, a third subset of tertiary channels can branch from the first secondary channel and fluidly connect the first secondary channel to the outlet leg.

In any of the above cold plates, a fourth subset of tertiary channels can branch from the inlet leg and fluidly connect the inlet leg to the second secondary channel.

In any of the above cold plates, the primary channel can have a first average cross-sectional area.

In any of the above cold plates, one of the first secondary channel and second secondary channel can have a second average cross-sectional area.

In any of the above cold plates, one of the plurality of tertiary channels can have a third average cross-sectional area.

In any of the above cold plates, the first average cross-sectional area can be greater than the second average cross-sectional area, and the second average cross-sectional area can be greater than the third average cross-sectional area.

In any of the above cold plates, at least one of the plurality of tertiary channels can include one of internal fins, a solid material with pores, and a lattice structure configured to permit an amount of fluid to flow therethrough.

In any of the above cold plates, the fluid circuit can be configured to simultaneously pass a flow of a cooling fluid in a first direction and a second direction perpendicular to the first direction.

A cold plate assembly includes an outer housing, a fluid circuit within the outer housing, and at least one heat-generating component mounted to and in a thermal exchange relationship with the outer housing. The fluid circuit includes a fluid inlet, a fluid outlet, and a primary channel disposed between and fluidly connecting the fluid inlet and the fluid outlet. The fluid circuit further includes a plurality of secondary channels branching from the primary channel and a plurality of tertiary channels branching from a first of the plurality of secondary channels and a second of the plurality of secondary channels.

The assembly of the preceding paragraph can optionally include, additionally and/or alternatively, any one or more of the following features, configurations and/or additional components:

The above assembly can further include a peripheral wall disposed within the fluid circuit and at least partially defining the primary channel, and a center wall disposed within the fluid circuit and at least partially defining the primary channel and the plurality of secondary channels.

In any of the above assemblies, the tertiary channels can be disposed within the center wall.

Any of the above assemblies can further include at least one hole disposed through one of the peripheral wall and the center wall, the at least one hole configured to accommodate a fastener.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A cold plate comprising:
   an outer housing comprising a plurality of sidewalls;
   a fluid circuit within the outer housing, the fluid circuit comprising:
      a fluid inlet located on a first sidewall of the plurality of sidewalls;
      a fluid outlet located on the first sidewall of the plurality of sidewalls;
      a primary channel disposed between and fluidly connecting the fluid inlet and the fluid outlet, the primary channel comprising:
         an inlet leg downstream of the fluid inlet;
         an outlet leg upstream of the fluid outlet and parallel to the inlet leg; and
         a connecting portion directly fluidly connecting the inlet leg to the outlet leg;
      a peripheral wall in physical contact with and coextensive with at least a second sidewall of the plurality of sidewalls, the peripheral wall further being coextensive with and at least partially defining the primary channel;
      a plurality of secondary channels in fluid communication with the primary channel, the plurality of secondary channels comprising:
         a first secondary channel branching from the inlet leg of the primary channel; and
         a second secondary channel branching from the outlet leg of the primary channel;
      a center wall disposed within the core body between the inlet leg and the outlet leg, the center wall at least partially defines the first secondary channel and the second secondary channel; and
      a plurality of tertiary channels disposed within the center wall and in fluid communication with at least one of the plurality of secondary channels;
      wherein an average cross-sectional area of each of the plurality of secondary channels is less than an average cross-sectional area of the primary channel;
      wherein an average cross-sectional area of each of the plurality of tertiary channels is less than the average cross-sectional area of each of the plurality of secondary channels; and
      wherein the number of tertiary channels is greater than the number of secondary channels.

2. The cold plate of claim 1, wherein the primary channel has a u-shaped geometry.

3. The cold plate of claim 2, wherein each of the first secondary channel and second secondary channel directly fluidly connect the inlet leg and the outlet leg.

4. The cold plate of claim 2, wherein the center wall has a meandering geometry, and wherein each of the first secondary channel and second secondary channel are truncated by the center wall.

5. The cold plate of claim 2, wherein a first subset of the plurality of tertiary channels branch from the first secondary channel and fluidly connect the first secondary channel to the outlet leg.

6. The cold plate of claim 5, wherein a second subset of tertiary channels branch from the first secondary channel and fluidly connect the first secondary channel to the second secondary channel.

7. The cold plate of claim 6, wherein a third subset of tertiary channels branch from the first secondary channel and fluidly connect the first secondary channel to the outlet leg.

8. The cold plate of claim 7, wherein a fourth subset of tertiary channels branch from the inlet leg and fluidly connect the inlet leg to the second secondary channel.

9. The cold plate of claim 2, wherein at least one of the plurality of tertiary channels comprises one of internal fins, a solid material with pores, and a lattice structure configured to permit an amount of fluid to flow therethrough.

10. The cold plate of claim 1, wherein the fluid circuit is configured to simultaneously pass a flow of a cooling fluid in a first direction and a second direction perpendicular to the first direction.

11. A cold plate assembly comprising:
- an outer housing comprising a plurality of sidewalls;
- a fluid circuit within the outer housing, the fluid circuit comprising:
  - a fluid inlet;
  - a fluid outlet;
  - a primary channel disposed between and fluidly connecting the fluid inlet and the fluid outlet, the primary channel comprising:
    - an inlet leg downstream of the fluid inlet;
    - an outlet leg upstream of the fluid outlet and parallel to the inlet leg; and
    - a connecting portion directly fluidly connecting the inlet leg to the outlet leg;
  - a peripheral wall in physical contact with and coextensive with at least two of the plurality of sidewalls, the peripheral wall further being coextensive with and at least partially defining the primary channel;
  - a plurality of secondary channels branching from the primary channel; and
  - a plurality of tertiary channels branching from the secondary channels and fluidly connecting a first of the plurality of secondary channels and a second of the plurality of secondary channels;
  - wherein an average cross-sectional area of each of the plurality of secondary channels is less than an average cross-sectional area of the primary channel;
  - wherein an average cross-sectional area of each of the plurality of tertiary channels is less than the average cross-sectional area of each of the plurality of secondary channels; and
  - wherein the number of tertiary channels is greater than the number of secondary channels; and
- at least one heat generating-component mounted to and in a thermal exchange relationship with the outer housing.

12. The assembly of claim 11 and further comprising:
- a center wall disposed within the fluid circuit and at least partially defining the primary channel and the plurality of secondary channels.

13. The assembly of claim 12, wherein the tertiary channels are disposed within the center wall.

14. The assembly of claim 13 and further comprising:
- at least one hole disposed through one of the peripheral wall and the center wall, the at least one hole configured to accommodate a fastener.

* * * * *